(12) United States Patent
Rubbmark et al.

(10) Patent No.: US 6,212,402 B1
(45) Date of Patent: Apr. 3, 2001

(54) SYSTEM CONNECTOR

(75) Inventors: Jan Ragnar Rubbmark; Göran Claes Pehrsson; Magnus Hans Hansson, all of Malmö (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 08/746,339

(22) Filed: Nov. 8, 1996

Related U.S. Application Data (60) Provisional application No. 60/030,121, filed on Nov. 4, 1996.

(51) Int. Cl.⁷ .......................... H04Q 7/32; H03K 19/0175
(52) U.S. Cl. ............................................. 455/557; 326/80
(58) Field of Search ..................................... 455/557, 558, 455/559; 326/75, 80

(56) References Cited

U.S. PATENT DOCUMENTS

| | | | |
|---|---|---|---|
| 4,792,986 | * 12/1988 | Garner et al. | 455/575 |
| 4,977,339 | * 12/1990 | Denda | 326/80 |
| 5,115,148 | * 5/1992 | Kammerl et al. | 326/80 |
| 5,218,187 | * 6/1993 | Koenck et al. | 235/375 |
| 5,506,535 | * 4/1996 | Ratner | 327/333 |
| 5,541,985 | * 7/1996 | Ishii et al. | 379/111 |
| 5,680,063 | * 10/1997 | Ludwig et al. | 326/80 |
| 5,877,633 | * 3/1999 | Ng et al. | 326/80 |

FOREIGN PATENT DOCUMENTS

| | | | |
|---|---|---|---|
| 0 432 280A1 | * 6/1991 | (EP) . | |
| 0455252A2 | * 6/1991 | (EP) . | |
| WO93/12604 | * 6/1993 | (EP) . | |
| WO94/09586 | * 4/1994 | (WO) . | |

OTHER PUBLICATIONS

"Mating Logic Families", 2420 Elektor, Feb. 1984, No. 2, Canterbury, Kent, Great Britain.*
"Simple Circuit Interface TTL to CMOS with use of only a single 12–V supply", Electronic Design 25, Dec. 6, 1976.*

* cited by examiner

Primary Examiner—Andrew M. Dolinar
(74) Attorney, Agent, or Firm—Burns, Doane, Swecker & Mathis, L.L.P.

(57) ABSTRACT

A system connector is provided to allow for the communication of digital signals between two devices functioning at different operating voltages. The connector allows for the interfacing of the high and low signal logic levels through the use of each devices own operating voltage without the need for complex signal conversion of voltage levels. The connector may be used to allow communication between mobile phones and their accessories. The system connector may be incorporated into an accessory or portable device allowing the signal level interfacing between the portable device and accessory. The system connector supplies a high-level or low-level digital signal to a first device operating at a first voltage in response to a corresponding high-level or low-level digital signal from a second device operating at a second voltage. In addition, the system connector may also provide a high-level or low-level digital signal from a second device operating at a second voltage in response to a corresponding high-level or low-level digital signal from the first device operating at the first voltage.

11 Claims, 7 Drawing Sheets

SYSTEM CONNECTOR

This application claims priority under 35 U.S.C. 119(e) of provisional application Ser. No. 60/030,121, filed Nov. 4, 1996.

BACKGROUND

The present invention generally relates to interfacing between devices having different operating voltages, in particular, signal level interfacing between mobile phones and their associated accessories.

A continuing trend in portable devices is to provide devices with lower and lower operating voltages. Newer equipment and ASICs have been designed so that they may now run at much lower operating voltages. Lower operating voltages have many desirable benefits such as the need for fewer cells in a battery pack for portable devices. Operation at lower voltages can also improve speed, packaging density, and efficiency while reducing heat generation. Traditionally, most portable devices, such as mobile phones, have operating voltages of ~5 volts and digitally communicate at a 5 volt logic-level. However, it appears that the traditional 5 volt-logic technology is becoming increasingly displaced by newer circuitry that is designed to operate at ~3 volts supply voltage. For example, many existing mobile phones utilize 5 NiMH (Nickel Metal Hydride) cells, that correspond to a phone operating voltage of up to ~5 volts. In contrast, newer phones and their accessories are now being designed to utilize 3 NiMH cells or one Li-ion cell, that correspond down to an operating voltage of ~3 volts. As more systems adopt the three volt logic, a resulting problem presented to the designer is how to convert between three volt logic of newer mobile phones and the five volt logic of the previously existing accessories. Of course, one skilled in the art will recognize that this problem is not restricted to 3 and 5 volt logic level devices but can exist between any devices that communicate digitally with each other and that operate at different voltage levels.

One possible solution would be to provide a switched-mode voltage supply in the accessory or mobile phone. When the accessory (or mobile phone) was connected to a mobile phone (or accessory), the switched-mode voltage supply could be set to an appropriate voltage supply mode based upon the sensed voltage levels of the connected device. However, observation of available switches indicates that an operating efficiency of not much over 70% can be expected when working from, for example, a 5 volt input, delivering about 5 amps. Thus, a problem with this solution is that the voltage loses associated with the power switch, for example those across a free wheeling diode and associated the rectifying diodes, are too large a fraction of the 5 volts. This, in turn, may cause the resulting voltage to be at least a logically indetermination level. This problem is further aggravated by the relatively high current load involved.

Another possible solution would be to use a linear regulator to adjust the voltage of a fixed 5 volt supply to three volts when a connected device operated at the lower logic level. However, considering additional factors, such as electrical noise and circuit complexity, using a linear regulator becomes considerably less attractive. For example, the operating efficiency of a linear regulator used to convert 5 volt to 3 volt is only about 60%. It is therefore apparent that using a linear regulation in combination with a fixed voltage supply is even less desirable than using a switched mode voltage supply to solve this problem.

As portable devices, such as mobile phones or lap tops, switch to different operating voltages, more and more existing devices will be incompatible with newer devices and their accessories. In the case of mobile phones, newer mobile phones designed to operate at the 3 volt operating level will be incompatible with existing 5 volt operating level accessories and vice versa. As a result, there will be an increased need for signal level interfacing of the digital information that is to be communicated between devices in order for the newer devices and their accessories having different operating voltages and logic to be compatible.

SUMMARY

It is therefore an object of the present invention to provide an improved signal level interface such that accessories will be able to communicate with portable devices (e.g., mobile phones) that function at different operating voltages than the accessories or vice versa.

Another object of the present invention is to provide an easy way to allow serial digital communication between devices operating at different voltages without the need for complex voltage/signal conversion circuitry.

An additional object of the present invention is to utilize the signal from a portable device, such as a phone, with the portable device operating voltage as the power supply voltage for the buffer circuits in the accessories in order to achieve a similar interfacing effect but allowing for the higher signaling speed of the accessories. The signal from the portable device could also be an alternating signal containing the voltage level intended for communication. This voltage level could be sensed by the accessory and used to control an adjustable power source.

The foregoing and other objects are accomplished through implementation of a system connector that may be incorporated into an accessory or portable device allowing signal level interfacing between the portable device and accessory. The system connector supplies a high-level or low-level digital signal to a first device operating at a first voltage in response to a corresponding high-level or low-level digital signal from a second device operating at a second voltage. In addition, the system connector may also provide a high-level or low-level digital signal from a second device operating at a second voltage in response to a corresponding high-level or low-level digital signal from the first device operating at the first voltage.

BRIEF DESCRIPTION OF THE DRAWINGS

The forgoing and other features, objects and advantages of the invention will be understood by reading the following description in conjunction with the drawings, in which.

DETAILED DESCRIPTION

The various features of the invention will now be described with respect to the figures, in which like parts are identified with the same reference character.

Figure 1:
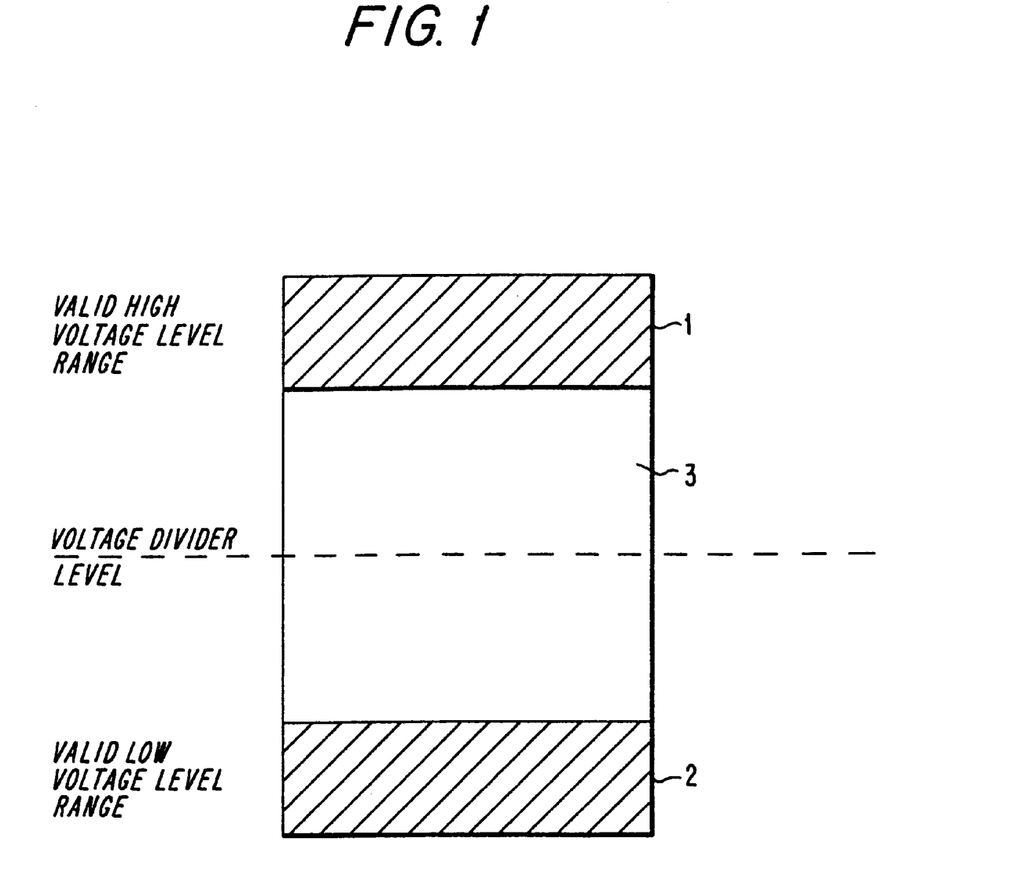
FIG. 1 illustrates a voltage range of acceptable logic levels for digital signals.

As is well known to those skilled in the art, most digital systems comprise a two value discrete, or binary, system in which combinations of the two discrete states are used to represent numbers, characters, codes, and other information. There are many advantages that binary systems have over analog systems. The solid state devices used in digital circuits are extremely reliable and consistent in their functions as long as they are maintained in either of two states. In addition, because they are maintained in either of two states, they are less susceptible to variations of environment and have a predetermined accuracy. The two discrete levels are typically defined as a high voltage level and a low voltage level. Turning to FIG. 1, a range of voltage levels is illustrated to show the two discrete states. Normally, the high-level of a digital signal, shown as range 1, is defined to be greater than 0.8 times the maximum operating voltage of the circuit. The lower-level, shown as range 2, is defined as less than 0.2 of the high-level circuit voltage values. If a signal is in the range 1 the device interprets the signal as a high-level or a "one" and if the signal is in the range 2, the device interprets the signal as a low-level or "zero". If the signal is between ranges 1 and 2, i.e., in range 3, the signal is indefinite and cannot be accurately interpreted by the circuit.

As newer devices are designed to function at lower operating voltages, the signal levels of the newer devices for the high and low states become incompatible with the older higher operating voltages. For instance, in FIG. 1, if a first device operating under traditional 5 volt-logic attempts to communicate with a device operating at a lower 3 volt-logic, the high or "one" state of the 3 volt-logic will be in the intermediate range 3 of the 5 volt-logic devices and therefore will be unable to be interpreted by the device operating at the 5 volt level. Therefore, according to the present invention, a system connector has been provided to allow devices operating at different voltages to interface and communicate with each other despite their otherwise incompatible logic levels.

Figure 2:
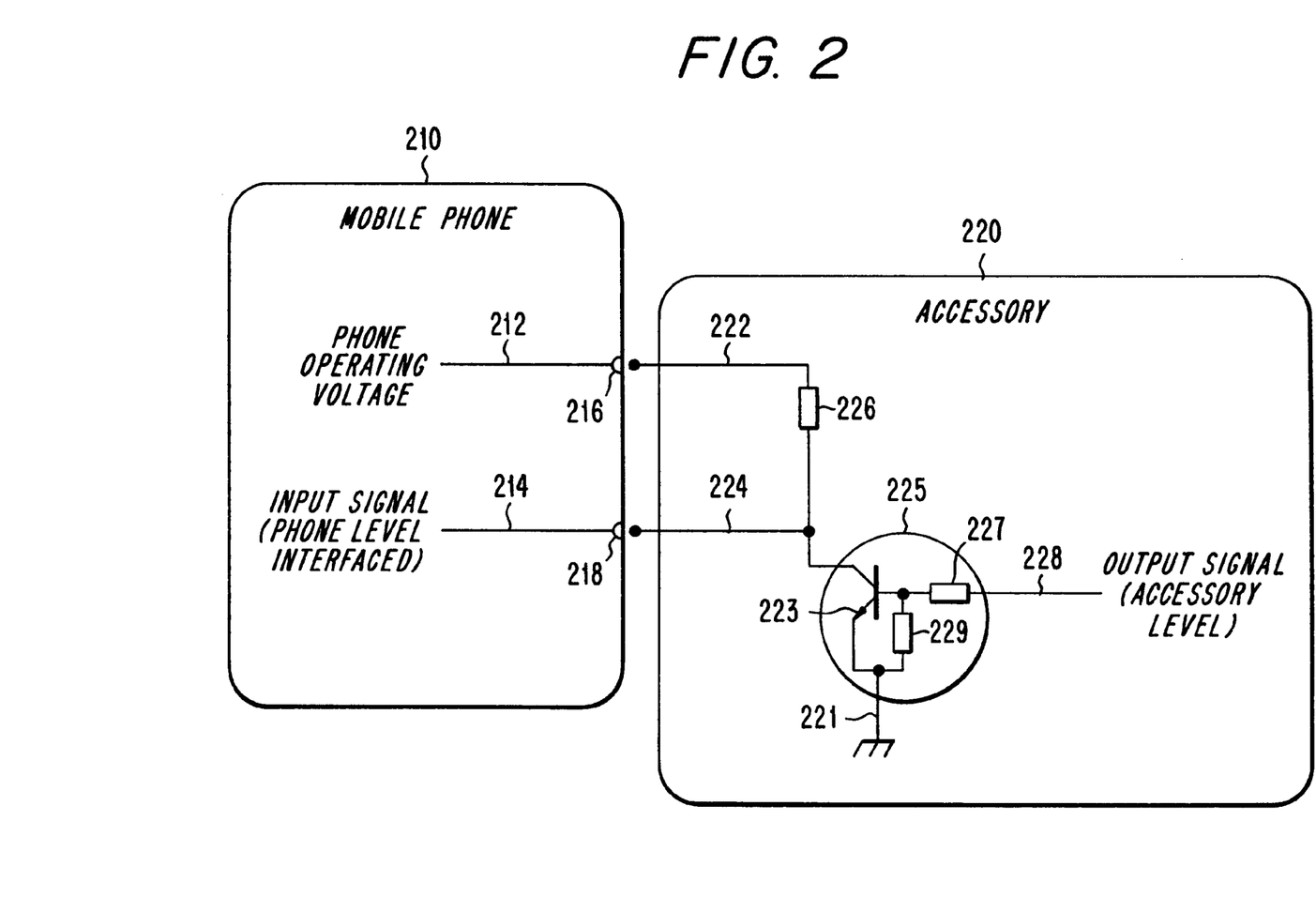
FIG. 2 is an exemplary block diagram of interfacing of an input-level of a mobile phone from an output-level of an accessory according to an embodiment of the present invention.

Turning to FIG. 2, an exemplary embodiment of a system connector, according to the present invention, is shown an output signal at the accessory level logic such that the data output from the accessory is supplied to the portable device at the operating logic level of the portable device. According to the FIG. 2, two devices, a mobile phone 210 and accessory 220, are shown. For the purposes of this and the following examples the mobile phone 210 can assumed to be operating at a 5 volt operating voltage and the accessory 220 at a 3 volt operating voltage.

According to FIG. 2 the accessory 220 may be coupled to the mobile phone 210 by two pins 222 and 224 which connect to slots 216 and 218 of the mobile phone. The phone operating voltage 212 is supplied to pin 222. Signals output from the accessory on pin 224 are provided as an input signal to line 214 of the mobile phone via slot 218. According to FIG. 2, signals are output by the accessory 220 and supplied on line 228 and input to a switch 225. According to one exemplary embodiment, the switch 225 consists of a BJT 223 whose emitter is tied to ground 221 of the accessory and whose base is connected to the voltage dividing resistors 227 and 229. When the accessory output signal on line 228 is a high-level logic value of the accessory device, e.g., between 2.4 V and 3.0 V, the high voltage level on line 228 will cause the transistor 223 to become non-conducting causing switch 225 to become open and supply a low-level to pin 224, as the pin will be tied to ground 221. In contrast, a low-level logic value from the accessory device on line 228 will cause the transistor 223 to become conducting and switch 225 to close. This in turn forces the input signal on pin 224 to be at a high-level, as pin 224 is then connected to the mobile phone operating voltage 212 via pin 222 and resistor 226. Thus, the high-level logic signal of the accessory has been interfaced to the high-level signal of the mobile phone and the mobile phone's own operating voltage is used to supply the high-level logic signal.

Figure 3:
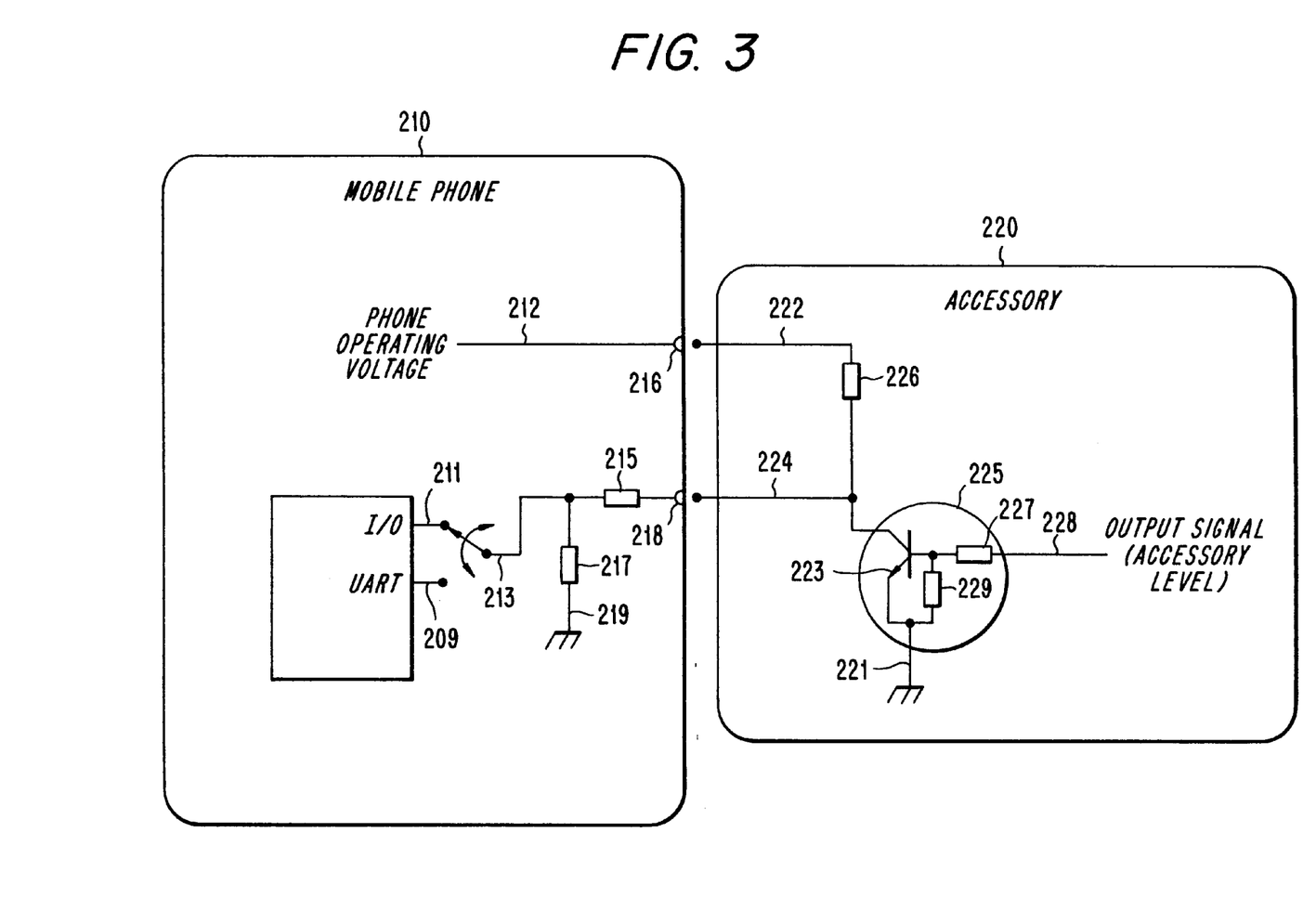
FIG. 3 is an exemplary block diagram of a serial data input level to a mobile phone with accessory presence sense functionality according to an alternative embodiment of the present invention.

An alternative embodiment for serial data input to the mobile phone is shown in FIG. 3. According to this embodiment port 218 is a serial port with additional circuitry added that allows the detection of the presence of a serial bus communicating accessory 220 when it is attached to the mobile phone via slot 216 and port 218. According to this embodiment a switch 213 has been added. Switch 213 is normally in default state A and connected to an input/output port 211. Default state A is defined to be of low potential when no accessories are present at port 218, as the switch 213 is tied to ground 219 through resistor 217. However, when a serial bus communicating accessory is connected to the mobile phone via slots 216 and 218, the resistor 226 will pull-up the potential input at port 218 close to the potential of the phone operating voltage 212. Circuitry or a processor (not shown) in the mobile phone detecting the high potential at the input/output port will cause the switch 213 to switch to state B connecting the output of accessory 220 to a UART (universal asynchronous receive and transmit) circuit 209. According to this embodiment, the mobile phone 210 can then detect the presence accessory 220 when it is attached to the slot 216 and 218. After establishing connection of the accessory 220 and switching to state B the phone 210 may then interrogate the accessory 220 to determine its type through UART 209.

The UART 209 provides the necessary interface functions for a microprocessor circuitry in the mobile phone allowing the mobile phone to communicate with a serial device accessory that may be attached to the port 218. Of course, other dedicated communication circuits may be used instead of the UART, for example an $I^2C$-bus.

Figure 4:
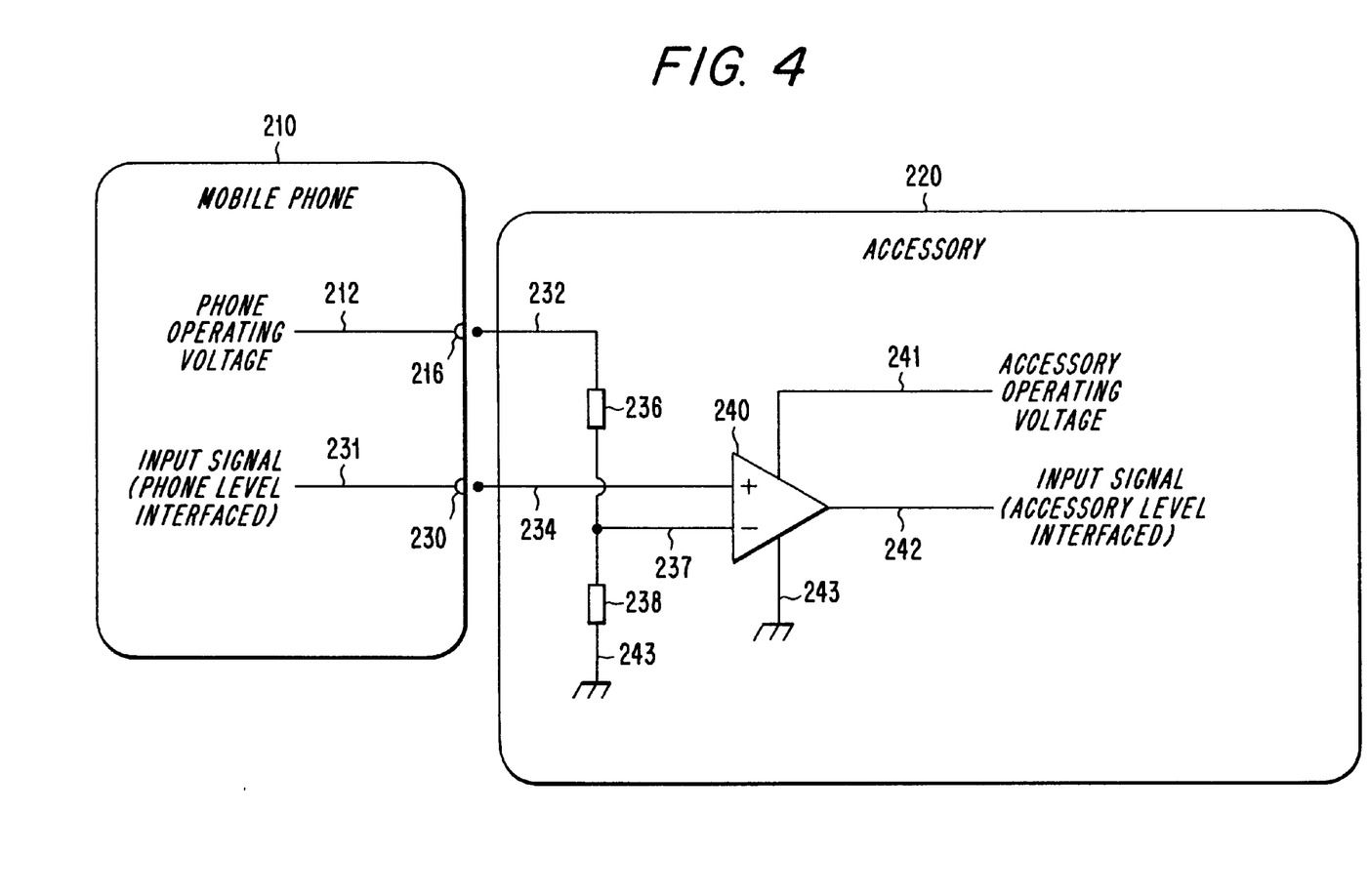
FIG. 4 is an exemplary block diagram of interfacing to an output level from a mobile phone to the input-level of an accessory according to another embodiment of the present invention.

Another exemplary embodiment according to the present invention is shown in FIG. 4, which illustrates an output signal level from the mobile phone 210 to an accessory 220. According to this embodiment a signal is output from the mobile phone via line 231 via port 232 to pin 234 of the accessory. In this situation, it is necessary to translate the high-level and low-level signals of the mobile phone to the logic high-level/low-level of the accessory. The mobile phone output signal 231 is fed into the positive terminal of an op-amp 240 (rail to rail output type) comparator. Pin 232 is connected to the phone operating voltage 212 through port 216. A reference signal is fed to the negative port of the op-amp via line 237. The reference signal is created from a voltage division of the phone operating voltage 212 by the resistor 236, tied to the operating voltage 212, and resistor 238, tied to ground 243 of the accessory. As the op-amp 240 is powered from the accessory operating voltage 241, the input signal to the accessory 242 is related to this voltage level. According to this embodiment, the reference signal 237 is then compared to the input signal 234 causing the comparator swing, rail to rail, between ground 243 and its supply voltage 241 (i.e., the accessory operating voltage). For example, if the input signal on line 234 from the mobile phone 210 was below the reference signal 237 then it would cause the comparator to swing to the ground rail and output accessory low level signal on line 242.

Figure 5:
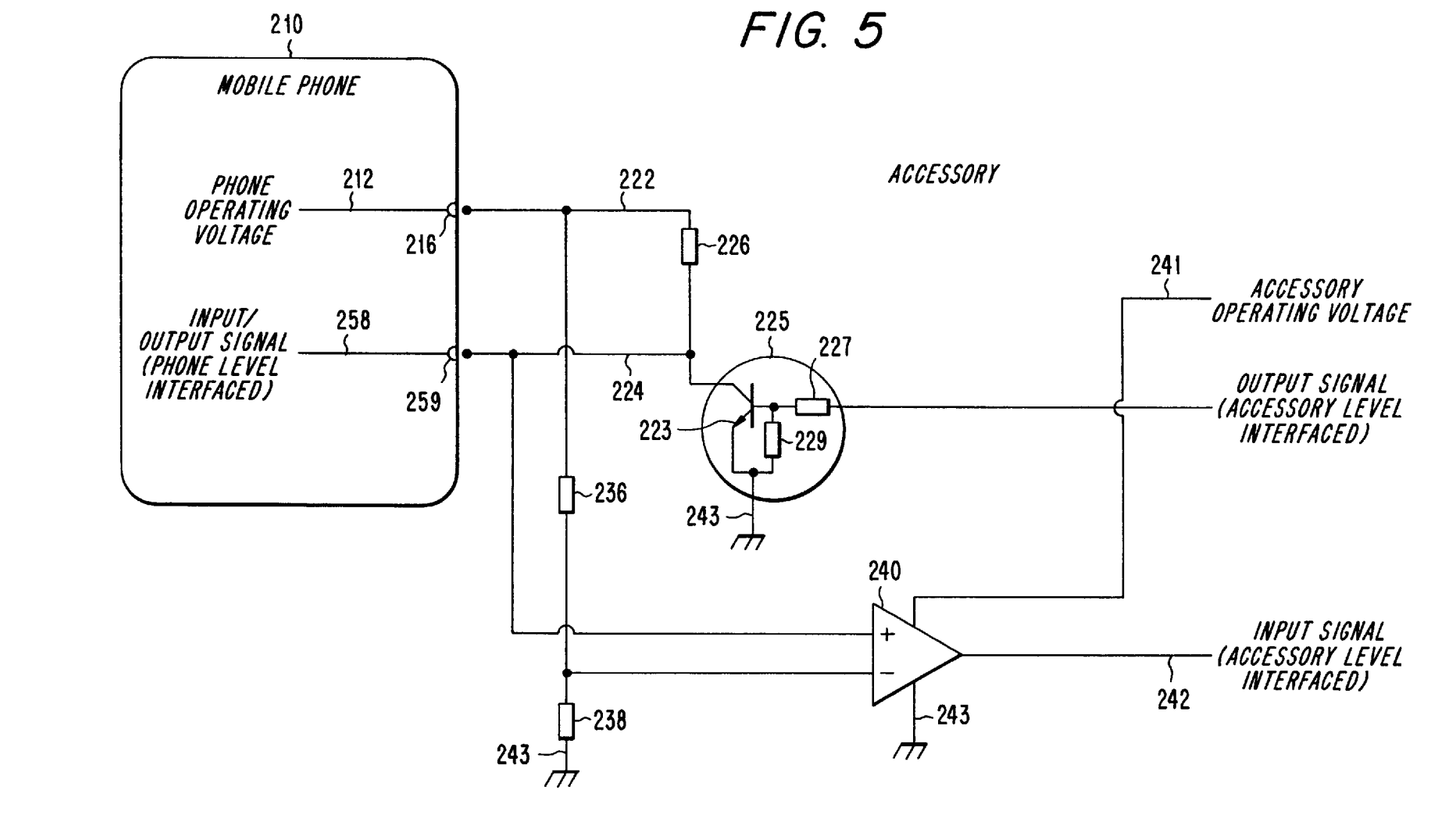
FIG. 5 is an exemplary block diagram illustrating a combined input and output signal interfacing according to the present invention.

FIG. 5 depicts a combined embodiment providing for transforming output signals from the phone to the accessory and input signals to the phone from the accessory. According to this exemplary embodiment, the previous solutions for input and output interfacing as described above are combined. According to this embodiment the input port 259 and line 258 will be a tri-state input port wherein there is a mutual understanding between the mobile phone and the accessory as to which direction the communication will be directed. According to this embodiment an I$^2$C-bus (not shown) could be used to receive/transmit signals on line 258. One skilled in the art will appreciate that separate ports could be provided within the mobile phone for input and output as described above.

Figure 6:
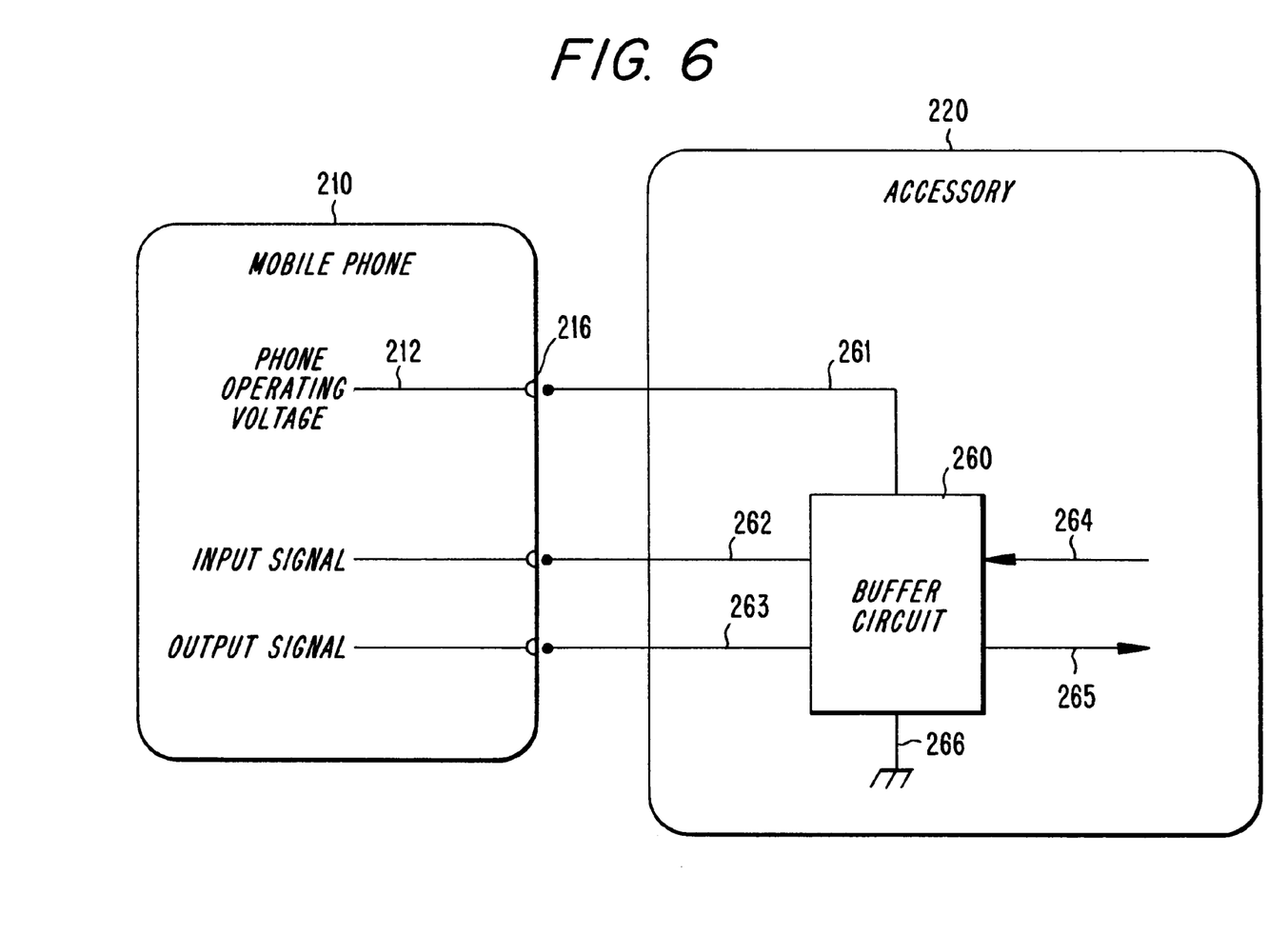
FIGS. 6 and 7 are exemplary block diagrams of interfacing with buffer circuits of the accessory device according to the present invention.
Figure 7:
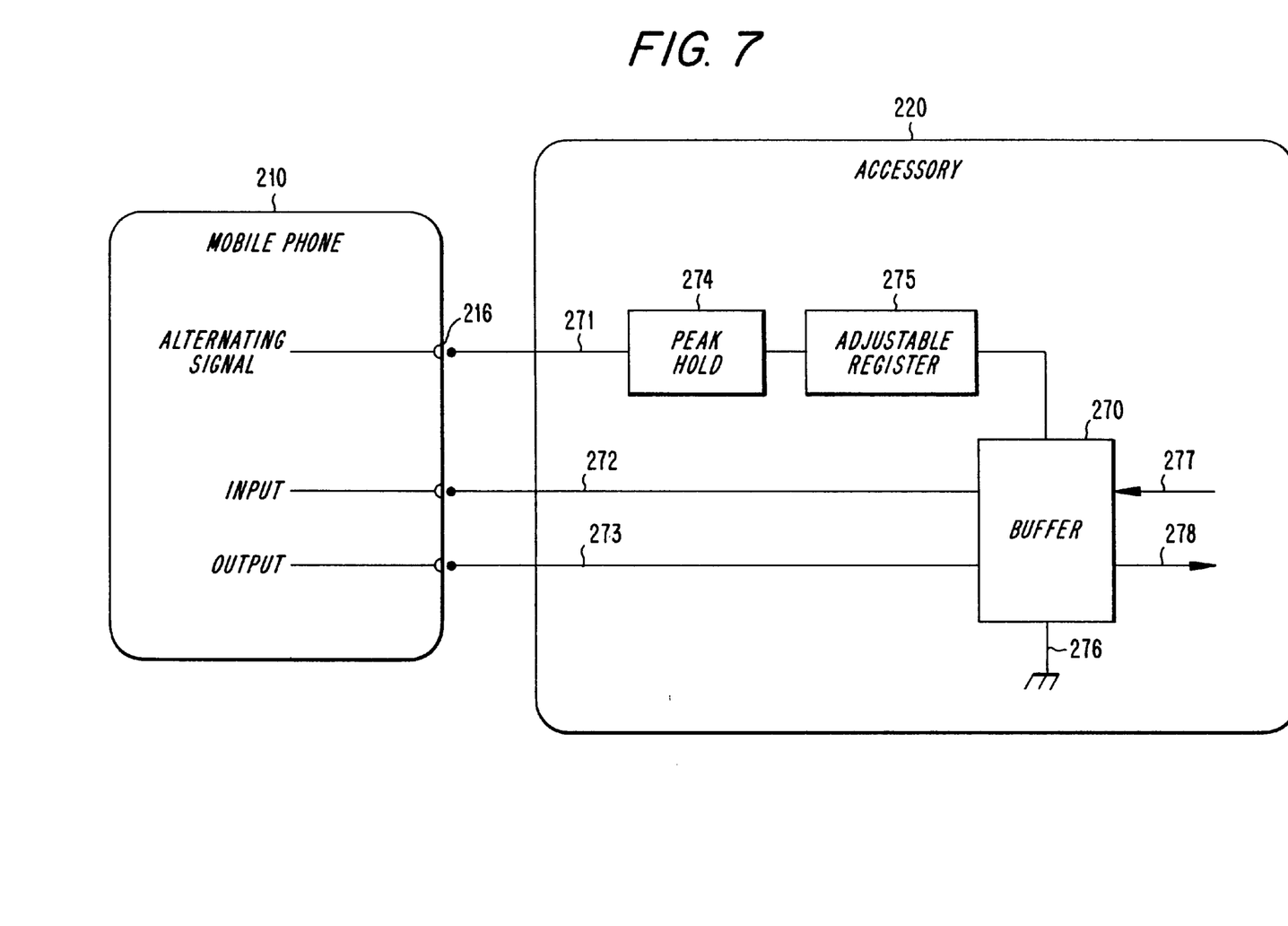

Two additional exemplary embodiments according to the present invention are also shown in FIG. 6 and FIG. 7. The embodiment illustrated that in FIG. 6 shows a signal 212a from the portable device 210, for example a mobile phone, could supply the operating voltage as the power supply voltage for the buffer circuits 260 in the accessories in order to achieve a similar interfacing effect but allow for the higher signalling speed of the accessories. The embodiment in FIG. 7 additionally illustrates that the signal from the portable device could also be an alternating signal 212b. According to this embodiment the alternating signal 212b would contain the voltage level intended for communication. The voltage level could be sensed and held by element 274 and used to set an adjustable register 275 to provide an adjustable power source to buffer 270.

Many different accessories are contemplated according to the present invention. Some examples through not exhaustive include: battery charges, hand-free equipment, modems, facsimile machines, laptops and other types of computers, etc. In addition the connection between the mobile phone an accessory may be by any means capable of transmitting digital signals.

Although the previous exemplary embodiments have been described in reference to a mobile phone and an accessory it is understood by one skilled in the art that any devices with different operating voltages may be interfaced in a similar manner and that the operating voltages of approximately 5 volts and approximately 3 volts merely present one of many possible embodiments according to the present invention. Different operating voltages and voltage levels could easily be used according to the present invention. In addition, the operating logic-level of either device does not necessarily have to be the same as the device's operating voltage. For example, the output of port 216 of FIG. 2 could be at a voltage other than the operating voltage, having been drawn off some part of the device 210. Furthermore, the voltage could actually be higher than the operating voltage if the voltage has been stepped-up.

Additionally, any number of slots and pins could be provided in either device wherein some pins/slots could be dedicated and would depend on the functionality of the particular device in question. Furthermore, while the above embodiments have depicted the interfacing logic as incorporated into the accessory, one skilled in the art would recognize that the interface circuitry could also be placed in the mobile phone. However, as there are typically fewer accessories produced than mobile phones it may be cost effective to place the circuitry in the accessory as a way overall system manufacturing cost may be reduced.

The present invention has been described by way of example, and modifications and variations of the exemplary embodiments will suggest themselves to skilled artisans in this field without departing from the spirit of the invention. The preferred embodiments are merely illustrative and should not be considered restrictive in any way. The scope of the invention is to be measured by the appended claims, rather than the preceding description, and all variations and equivalence which followed in the range of the claims are intended to be embraced therein.

What is claimed is:

1. A system for connecting detachable first and second devices, wherein each device functions at a different operating voltage, comprising:

an output of the first device for outputting a high-level voltage of the first device;

an input of the first device for inputting digital signals;

a digital transistor for switching between a high-level voltage and low-level voltage; and an output of the second device for outputting digital signals, wherein the digital transistor provides the high-level voltage of the first device from the first device output to the input of the first device in response to detecting a high-level voltage from the second device output and provides a low-level voltage to the input of the first device in response to detecting a low level voltage from the second device output, wherein a high-level input from the second device to the digital transistor opens the transistor connecting the input of the first device to a ground of the second device, and wherein a low-level input from the second device to the digital transistor closes the transistor connecting the input of the first device to an operating voltage of the first device, and wherein the first device is a mobile phone and the second device is a mobile phone accessory.

2. A system according to claim 1, wherein the high-level voltage of the first device is approximately the operating voltage of the first device and the low-level voltage of the second device is approximately the ground of the second device.

3. A system connector providing digital communication between two devices comprising:

first means for supplying a high-level or low-level digital signal to a first device having a first operating voltage in response to a corresponding high-level or low-level digital signal from a second device operating at a second voltage; and second means for supplying a high-level or low-level digital signal to the second device operating at the second voltage in response to a corresponding high-level or low-level digital signal from the first device operating at the first voltage, wherein the first means includes a digital transistor and wherein a high-level input from the second device to the digital transistor opens the transistor connecting an input of the first device to a ground of the second device, and wherein a low-level input from the second device to the digital transistor closes the transistor connecting the input of the first device to the operating voltage of the first device.

4. The system of claim 3, wherein the first device is a mobile phone.

5. The system of claim 4, wherein the first and second means are located in the accessory.

6. The system of claim 3, wherein the second device is a mobile phone accessory.

7. The system connector of claim 3, wherein the second means includes means for comparing a reference signal and the high-level or low-level digital signal supplied from the first device, and wherein a comparator outputs a high-level signal according to the operating voltage of the second device when the digital signal is a high-level value according to the operating voltage of the first device and outputs a low-level signal according to the operating voltage of the second device when the digital signal is a low-level value according to the operating voltage of the first device.

8. A combination mobile phone and accessory comprising:

first means for supplying a high-level or low-level digital signal to a mobile phone in response to a corresponding high-level or low-level digital signal from the accessory; and second means for supplying a high-level or low-level digital signal to the accessory in response to a corresponding high-level or low-level digital signal from the mobile phone, wherein the first means includes a digital transistor and wherein a high-level input from the second device to the digital transistor opens the transistor connecting an input of the first device to a ground of the second device, and wherein a low-level input from the second device to the digital transistor closes the transistor connecting the input of the first device to the operating voltage of the first device.

9. The combination mobile phone and accessory according to claim 8, wherein the mobile phone and accessory have different operating voltages.

10. The combination mobile phone and accessory according to claim 9, wherein the mobile phone has an operating voltage of approximately 5 volts and the accessory has an operating voltage of approximately three volts.

11. The system connector of claim 8, wherein the second means includes means for comparing a reference signal and the high-level or low-level digital signal supplied from the first device, and wherein a comparator outputs a high-level signal according to the operating voltage of the second device when the digital signal is a high-level value according to the operating voltage of the first device and outputs a low-level signal according to the operating voltage of the second device when the digital signal is a low-level value according to the operating voltage of the first device.

* * * * *